(12) United States Patent
Lienau

(10) Patent No.: US 6,229,729 B1
(45) Date of Patent: May 8, 2001

(54) MAGNETO RESISTOR SENSOR WITH DIODE SHORT FOR A NON-VOLATILE RANDOM ACCESS FERROMAGNETIC MEMORY

(75) Inventor: Richard M. Lienau, Santa Fe, NM (US)

(73) Assignee: Pageant Technologies, Inc. (Micromem Technologies, Inc.), Toronto (CA)

(*) Notice: Subject to any disclaimer, the term of this patent is extended or adjusted under 35 U.S.C. 154(b) by 0 days.

(21) Appl. No.: 09/515,963

(22) Filed: Feb. 29, 2000

Related U.S. Application Data

(60) Provisional application No. 60/122,733, filed on Mar. 4, 1999.

(51) Int. Cl.⁷ .................................................. G11C 11/22
(52) U.S. Cl. ........................... 365/145; 365/157; 365/65; 365/66; 365/171; 365/172; 365/173
(58) Field of Search ................................. 365/145, 157, 365/65, 66, 171, 172, 173

(56) References Cited

U.S. PATENT DOCUMENTS

| | | |
|---|---|---|
| 3,048,829 | 8/1962 | Bradley . |
| 3,223,985 | 12/1965 | Bittmann et al. . |
| 3,418,645 | 12/1968 | Fussell . |
| 3,466,634 | 9/1969 | Gamblin . |
| 3,613,013 | 10/1971 | Vallese . |
| 3,714,523 | 1/1973 | Bate . |
| 3,727,199 | 4/1973 | Lekven . |
| 4,283,643 | 8/1981 | Levin . |
| 4,360,899 | 11/1982 | Castro . |
| 4,607,271 | 8/1986 | Popovic et al. . |
| 4,791,604 | 12/1988 | Lienau . |
| 4,803,658 | 2/1989 | Grimes . |
| 4,831,427 | 5/1989 | Coleman, Jr. . |
| 4,887,236 | 12/1989 | Schloemann . |
| 5,068,826 | 11/1991 | Matthews . |
| 5,075,247 | 12/1991 | Matthews . |
| 5,089,991 | 2/1992 | Matthews . |
| 5,107,460 | 4/1992 | Matthews . |
| 5,206,590 | 4/1993 | Dieny et al. . |

(List continued on next page.)

*Primary Examiner*—Vu A. Le
*Assistant Examiner*—VanThu Nguyen
(74) *Attorney, Agent, or Firm*—Jones, Waldo, Holbrook & McDonough; Michael W. Starkweather

(57) ABSTRACT

A non-volatile RAM device is disclosed which utilizes a plurality of ferromagnetic bits (8) each surrounded by a write coil (15) for directing the remnant polarity thereof is disclosed. The direction of magnetic remnance in each bit (8) is dictated by the direction of a current induced into write coil (15). Further, a magneto sensor (9) comprising a magneto resistor (18) coupled to a diode (26) is placed approximate each bit (8). The magneto resistor (18) is coupled to a sense line (20), and receives current at a first point of attachment, and returns current at a second point of attachment. The current passing across magneto resistor (18) is biased in a direction either right or left of the original current flow direction. If current is biased toward the anode end of diode (26) then it is complimentary to the preferred flow direction of diode (26), and flows easily there across. The ultimate effect is that the serial resistance of magneto resistor (18) is reduced, allowing a greater amount of current to pass into the sense line (20). When current is biased toward the cathode end of diode (26), then it is contrary to the preferred flow direction of the diode (26), and does not flow easily there across. The ultimate effect is that the serial resistance of magneto resistor (18) is increased, allowing a smaller amount of current to pass into sense line (20). The presence and amount of current found in the sense line (20) between the bit (8) and the detector (14) determines whether a digital value of "1" or "0" is stored in the magnetic bit (8). A method for storing binary data is also disclosed.

25 Claims, 3 Drawing Sheets

U.S. PATENT DOCUMENTS

| | | |
|---|---|---|
| 5,208,477 | 5/1993 | Kub . |
| 5,289,410 | 2/1994 | Romney et al. . |
| 5,295,097 | 3/1994 | Lienau . |
| 5,329,480 | 7/1994 | Chuan et al. . |
| 5,329,486 | 7/1994 | Lage . |
| 5,396,455 | 3/1995 | Brady et al. . |
| 5,477,482 | 12/1995 | Prinz . |
| 5,661,062 | 8/1997 | Prinz . |
| 5,793,697 * | 10/2000 | Scheuerlein ............... 365/230.07 |
| 5,864,498 | 1/1999 | Womack . |
| 5,926,414 | 7/1999 | McDowell et al. . |
| 5,930,165 | 7/1999 | Johnson et al. . |
| 6,034,887 | 3/2000 | Gupta . |
| 6,130,835 * | 10/2000 | Scheuerlein ................... 365/171 |

* cited by examiner

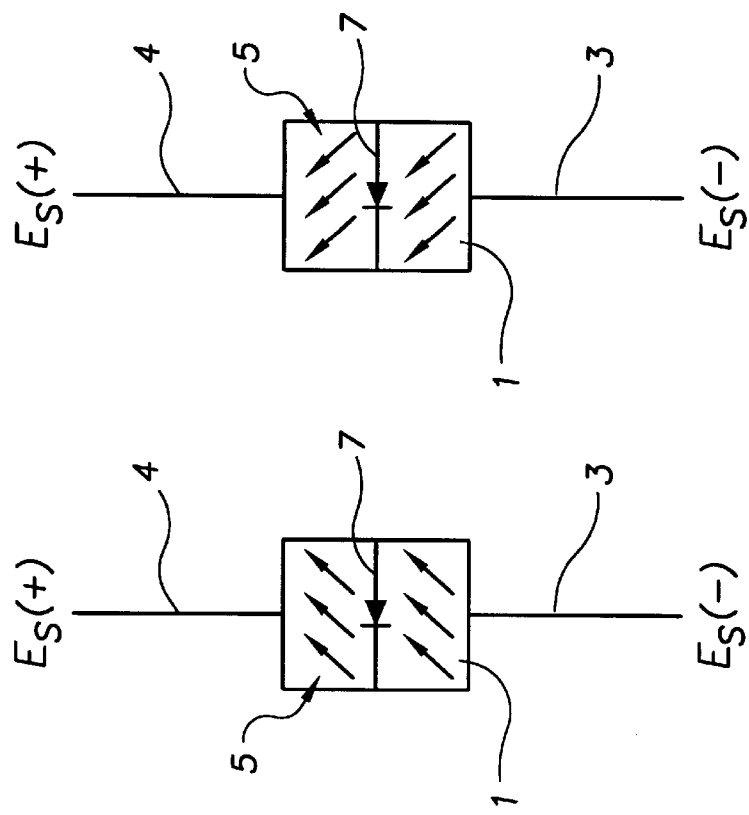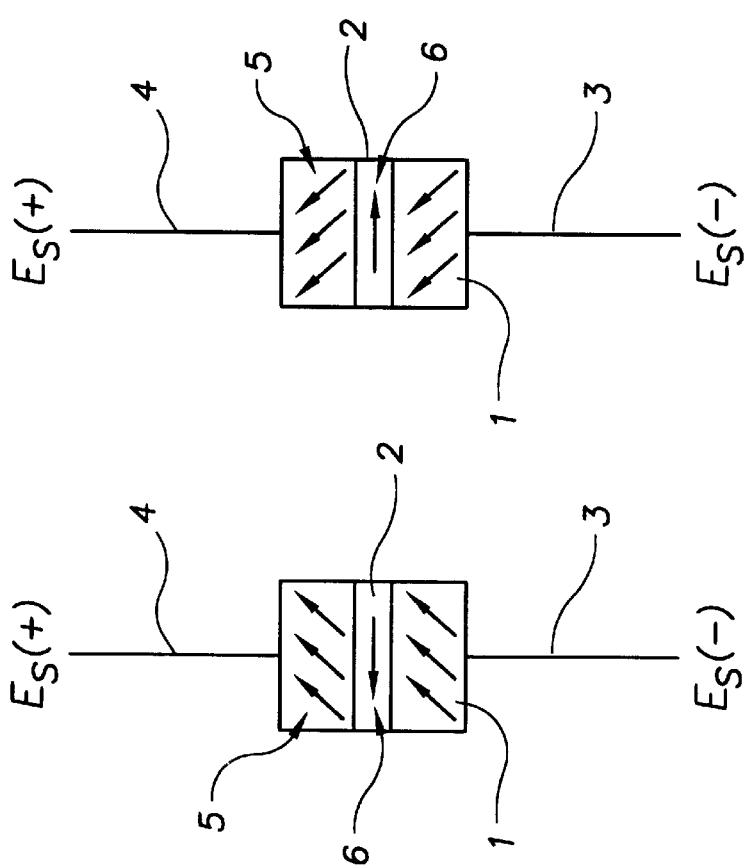

MAGNETO RESISTOR SENSOR WITH DIODE SHORT FOR A NON-VOLATILE RANDOM ACCESS FERROMAGNETIC MEMORY

PRIORITY OF THE INVENTION

This application claims priority to co-pending U.S. Provisional Application No. 60/122,733, filed Mar. 4, 1999.

RELATED PATENT APPLICATIONS

The following provisional patent applications are related to the present invention:

Ser. No. 60/122,731 Mar. 4, 1999
Ser. No. 60/121,901 Mar. 4, 1999
Ser. No. 60/121,925 Mar. 4, 1999
Ser. No. 60/122,822 Mar. 4, 1999

THE FIELD OF THE INVENTION

The present invention relates to non-volatile random access memory. More particularly, the present invention relates to a magneto resistor sensor with diode short for a non-volatile random access ferromagnetic memory.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, the core would be programmed with either a north or south directed flux path that would correspond to a logic one or zero. The advantage of magnetic core memory is that it is non-volatile, or does not need to be refreshed to remember the stored logic signal. Additionally, Core memory is also "radiation-hard" or unaffected by ionizing radiation like gama rays. However, the assembly of the magnetic core array was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. This constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remanent, (i.e. permanent) states, upon the simultaneous application of electrical pulses to a pair of conductors intersecting adjacent the selected cell. Each electrical pulse has an amplitude which is insufficient to inductively switch the remanent state of the selected cell. However, the combined amplitude of the electrical pulses is at least equal to the amplitude required for such a switch.

U.S. Pat. No. 5,068,826 to Mathews teaches a non-volatile, static magnetic memory device, whose operation is based on the Hall effect. The device includes a magnetic patch which stores data in the form of a magnetic field, a semiconductor Hall bar, and a pair of integrally-formed bipolar transistors which are used for amplifing and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lienau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. The memory is capable of being fabricated in a variety of different forms.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout RAMS in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minium size MOS device, a small cell may be realized that compares favorably with a conventional DRAM Rof FLASH memory cell. The greater degree of control over the magnetic field afforded by the magnetic structures enables the cross-coupling between cells in a memory array to be minimized.

U.S. Pat. No. 3,727,199 to Lekven teaches a magnet memeory element and a process for producing such elements in plurality to constitute a static magnetic memory or digital information storage system. Individual binary storage members are afforded directionally preferential magnetic characteristics by flux circuits to establish the preferred axis of magnetization. Conductors for driving the individual binary storage members (for storing and sensing) are provided in an organized pattern to accomplish selectivity. A batch production process is also disclosed.

OBJECTS AND SUMMARY OF THE INVENTION

It is therefore a feature of the present invention to provide a nonvolatile ferromagnetic RAM device which is capable of reading the data stored in each magnet quickly and efficiently utilizing a minimal number of components. Specifically, there is a nonvolatile ferromagnetic RAM which is capable of reading the data stored in each magnetic bit.

Additionally, a feature of the invention is to provide a ferromagnetic memory cell, comprising a bit (3), made of a ferromagnetic material, having a remnant polarity. There is also a write line (2), located proximate the bit, coupled to receive a current sufficient to create the remnant polarity. Further, there is a magneto sensor (9) which comprises: 1) a magneto resistor (18) positioned proximate the bit (3), having a serial resistance, and a current flow direction responsive to the remnant polarity of the bit (3); and 2) a diode (26), coupled across the magneto resistor to effectively control the serial resistance of the magneto resistor.

Another feature of the invention is to provide a memory cell with a sense line (20) coupled to the magneto resistor (18). The sense line (20) may be coupled to the magneto resistor (18) at a first attachment point which provides current to the magneto resistor( 8), and at a second point which receives current transferred across the magneto resistor (18).

Yet, an additional feature of the invention is to provide a memory cell with a detector (11), coupled to the sense line (20), which detects the presence and amount of current in the sense line(20). Particularly, the presence and amount of current in the portion of sense line (20) between the bit (8) and the detector (14) dictates whether a digital "1" or "0" is stored in the bit (8). In one case, the value of a "1" is signified when the amount of current in the sense line (20) between the bit (8) and the detector is greater than an amount present which signifies a "0." However, the assigned values of "1" and "0" may be changed so that the value of a "1" is signified when an amount of current in the sense line (20) between the bit (8) and the detector is less than an amount signifying a "0."

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 1 is a schematic view of a prior art magneto resistor with a shorting bar, having a current flow directed to the right.

FIG. 2 is a schematic view of a prior art magneto resistor with a shorting bar, having a current flow directed to the left.

FIG. 3 is a schematic view of a magneto resistor with a diode, as is well known in the prior art, having a current flow to the right. The diode has a preferred current flow direction to the right.

FIG. 4 is a schematic view of a magneto resistor with a diode, as is well known in the prior art, having a current flow to the left. The diode has preferred current flow direction to the right

Figure 5:
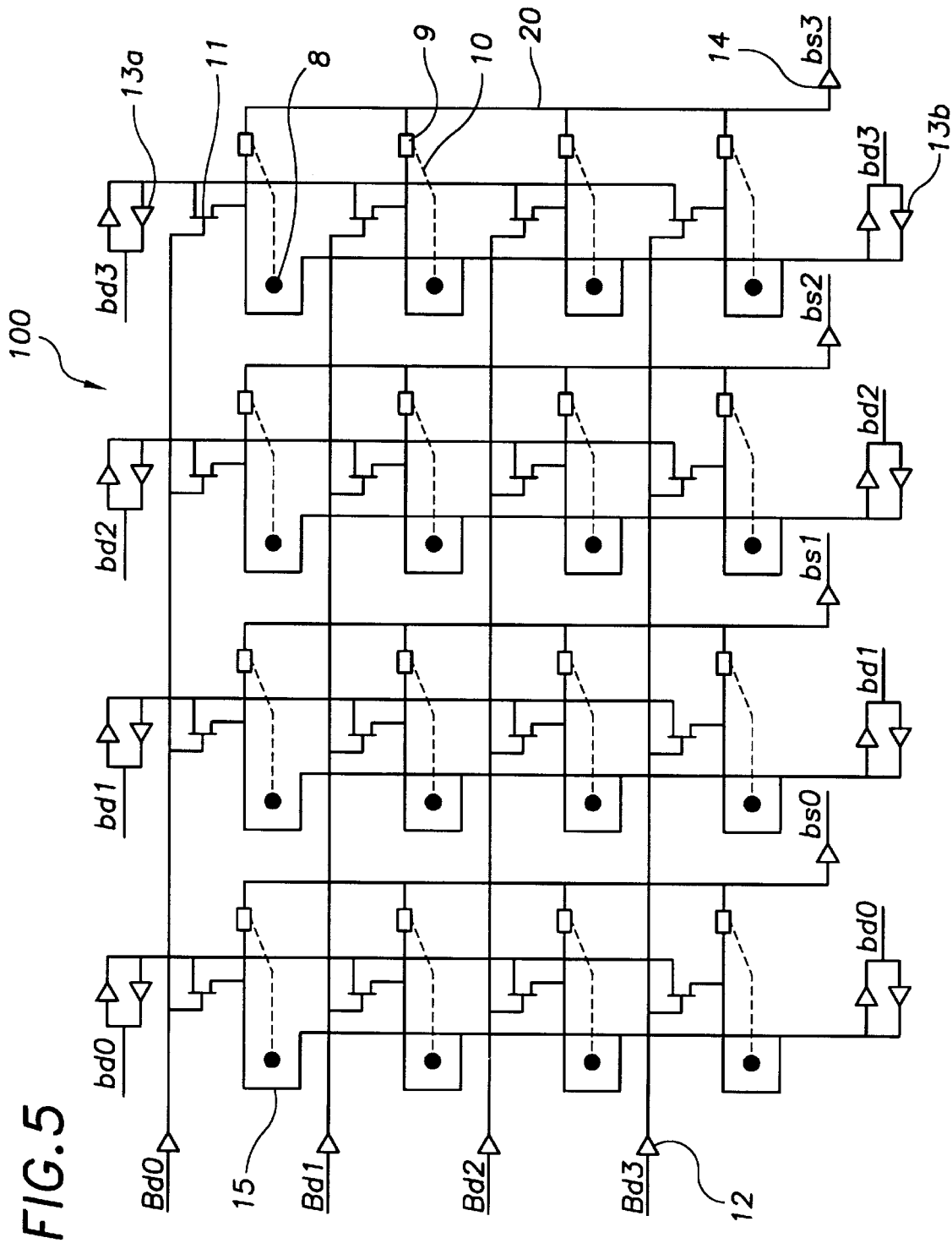
FIG. 5 is a is a schematic diagram of the nonvolatile random access ferromagnetic memory of the present invention.

It is noted that the drawings of the invention are not so scale. The drawings are merely schematic representations, not intended to portray specific parameters of the invention. The drawings are intended to depict only selected embodiments of the invention, and therefore should not be considered a limiting the scope of the invention. The invention will be described with additional specificity and detail through the use of the accompanying drawings. Like numbering between figures represent like elements.

DETAILED DESCRIPTION OF THE PREFERRED EMBODIMENT

The applicant has discovered that the reading of binary data stored within a ferromagnetic bit may be accomplished easily and efficiently using a magneto sensor in intimate communication therewith. Such a device requires no moving parts or refreshing of stored logic signals, and is capable of sensing magnetically stored data at the micron and submicron levels.

Referring now to FIGS. 1 and 2, there is shown a prior art Hall semiconductor configured as magneto resistor 1 with shorting bar 2 placed midpoint at ninety degrees (90°) along their current flow axis. The current received from input line 3, is biased in a selected direction, either left or right, as indicated by flow arrows 5. The biasing of current flow occurs because of the presence of a magnetic field (not shown). Normally, when current is biased in a side direction, the serial resistance of the magneto resistor is increased, thus inhibiting the flow of current out of magneto resistor 1, and into receiving line 4. In fact, the increase in serial resistance is proportional to the strength of the magnetic field exerted.

In the case of FIG. 1, the current is biased to the right due to the remnance of the magnetic field being exerted on magneto resistor 1. Therefore, the negative carriers of magneto resistor 1 are crowded toward the right, and effectively supply shorting bar 2 with an electron source on the right. These electrons then flow rapidly across shorting bar 2, as shown by directional arrow 6, to the opposite, positively-biased side, thus re-supplying electrons as though that were the supply source like, input line 3. This action serves to speed carrier transmission into receiving line 4, by reducing the serial resistance of magneto resistor 1. The same process happens in FIG. 2 only in an opposite manner, as the current flow is biased to the left due to the remnance of a reversed magnetic field exerted on magneto resistor 1.

FIGS. 3 and 4, on the other hand, show magneto resistor 1, with the shorting bar replaced by a diode 7, having a cathode on the left and an anode on the right. Because the cathode is on the left, diode 7 has a preferred flow direction for negatively charged particles to the right, and is highly resistive to leftward current flow of negatively charged particles toward the cathode on the left. Like FIGS. 1 and 2, current arrows 5, show that current is being biased in a sideward direction by a magnetic field exerted on magneto resistor 1, due to the presence of a magnet (not shown). In FIG. 3, the current is biased to the right due to the remnance of the magnetic field being exerted, while in FIG. 4, the current is biased to the left due to the exertion of a magnetic field with an opposite remnance.

Referring again to FIG. 3, since the negative carriers are forced toward the right, diode 7 is effectively supplied with electrons at its anode on the right. Since electrons are extremely reluctant to flow toward the cathode on the left, this is the high resistance direction of the diode, and the effective serial resistance of magneto resistor 1 is increased. Therefore, a relatively small amount of current will be allowed to pass from input line 3, across magneto resistor 1, and out receiving line 4.

By contrast, FIG. 4 shows the opposite condition, with current flow biased toward the left side of magneto resistor 1. Now, the electrons are at the cathode end of diode 7, and are presented with a considerably lower resistance, in flowing toward the anode, thus allowing for the conduction of electrons from the left to the right side of diode 7. Under these circumstances, the magneto resistor 1 behaves as if it had a shorting bar, and the effective serial resistance is lowered. Therefore, a large amount of current will be allowed to flow from input line 3, across magneto resistor 1, and out through receiving line 4.

FIG. 5 is a partial schematic of a four bit byte, four byte random access memory matrix, 100. A plurality of individual ferromagnetic bits 8 are each surrounded by a drive, or write coil 15. Magneto sensor 9, comprising a magneto resistor with a diode disposed thereon, is placed proximate to the storage bit 8. The magnetic field produced by bit 8, which is felt by the magneto sensor, is represented by dashed line 10. It is noted that bit 8 is really located right under or on top of sensor 9, but is best illustrated schematically with the dash line 10. The byte drive circuit 13, is used during both set (write) and sense (read) operations to gate the byte select Field Emitting Transistors (FET)s, 11.

During write time, the write select circuits 13a & 13b at either end of the bit columns, and labeled bd0 through bd3, determine the current direction as defined by the requirement to set a "0" or a "1" into given memory cells in a given byte. Current thus flows between the upper and lower set select circuits 13a & 13b and the byte select gates 11 for the selected byte. Likewise, during sense, or "read" operations, FETs 11 are gated on by input amplifiers 12 coupled thereto, labeled BD0 through BD3, but carry current only from the upper bit select circuits 13a, through the corresponding FET onto sense line 20 and to the corresponding sense amplifiers 14, labeled bs0 through bs3. Sense amplifiers 14 amplify the presence and amount of any signal in the sense line.

Figure 6:
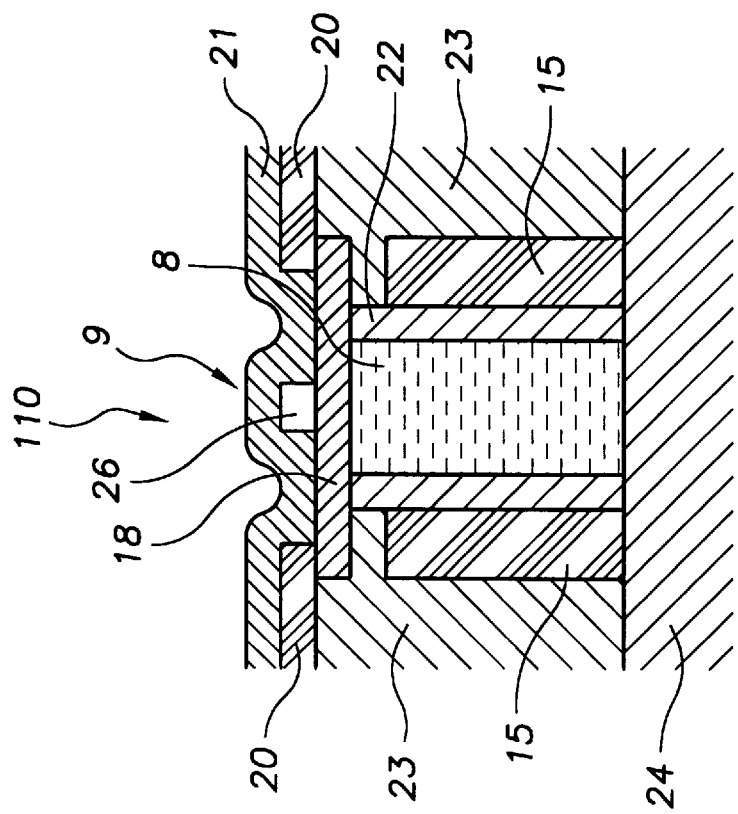
FIG. 6 is a side sectional view of the memory cell elements presented in FIG. 5, having a magneto sensor disposed below a ferromagnetic bit.
Figure 7:
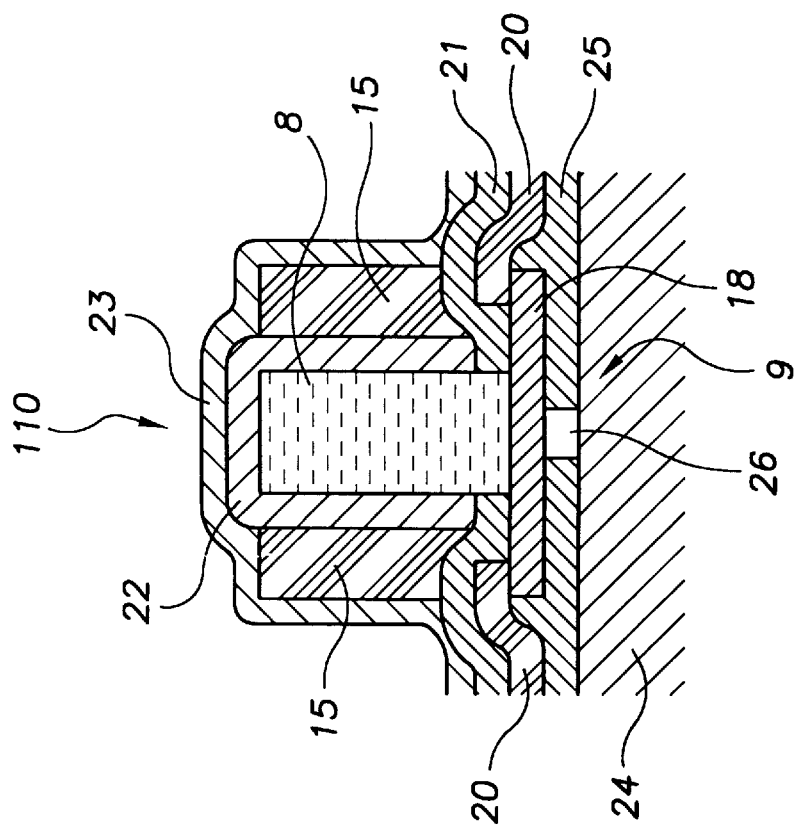
FIG. 7 is a side sectional view of the memory cell elements presented in FIG. 5, having a magneto sensor disposed above a ferromagnetic bit.

Referring now to FIGS. 6 and 7, there are shown typical cross-sections of a single micron or sub-micron scale ferromagnetic memory cell element 110 FIG. 4. FIG. 6 demonstrates memory cell 110 with magneto sensor 9 on the bottom, while FIG. 5 shows magneto sensor 9 on the top. There is no functional difference between these configurations. They are both shown to demonstrate that either construction can be employed; indeed, they may be combined into a single memory array.

In both FIGS. 6 and 7, ferromagnetic storage element, or "bit," 8, is placed upon a substrate 24, and surrounded by the set (write) coil 15. Substrate 24 may be made of any well known substance for making substrates such as silicon, glass, GaAs, etc., and write coil 15 may be made of any suitable conductive material known to those skilled in the art such as Al, Cu, etc. A layer of insulation 22, is disposed between the write line or coil 15, and bit 8. Further, insulative layer 21, 23, and 25 are filler insulation is disposed in the memory cell as needed. All of the insulative layers present may be made of any suitable insulative material well known in the art, such as $SiO_2$ or $Si_3N_4$, etc.

Magneto sensor 9, placed proximate to, and about bit 8, Magneto sensor 9 comprises a magneto resistor 18, which is made of a high-mobility semiconductor such as InSb, with diode 26 coupled there across. Diode 26 may be any cathode and anode bearing diode which is of the appropriate size and well known to those ordinarily skilled in the art. Note that no insulation is shown between the sensor 9 and the ferromagnetic bit 8, since no electrical potential exists between them in this configuration. This can be an advantage in that the sensor and bit are more intimately related than if there were insulation separating them, which makes for greater electrical sensitivity of the cell. Finally, substrate 24 and memory cell 110 may be fabricated by any method known to those skilled in the relevant art, such as electroplating, sputtering, E-beam deposition, chemical vapor deposition, micro-machineing, nano-technology and molecular beam epitaxy.

Method of Operation

In operation, either a digital value of "1" or "0" is assigned to the presence of either a large or small amount of current in sense line 20. For example, if a value of "1," is assigned to a large amount, and the value of "0" assigned to a small amount, then a digital value of "1" will be indicated when the amount of current in the sense line 20 is larger than the amount when a value of "0" is indicated, and vice versa.

Once the digital value has been assigned, it will be programmed into bits 8 as desired, and reflected in the remnant direction of the magnetic polarity of each. The remnant direction of each bit is dictated by the direction of a current flowing through write coil 15. When current is directed through write coil 15 in one direction, the magnetic remnance of a bit 8 will be caused to store a logical one, and when current is directed in the opposite direction through write coil 15, the remnance of bit 3 will be caused to store a logical zero..

The direction of magnetic remnance produced by bit 3 biases current flowing through magneto resistor 18 in a direction of either right or left to that of the original flow. Current is received into magneto resistor 18 from sense line 20 at a first point of attachment, and exited at a second point of attachment after passing across magneto resister 18. Diode 26 is coupled across magneto resistor 18, and in a preferred embodiment diode 26 has a longitudinal length running substantially perpendicular to the longitudinal length of magneto resistor 18.

Current which his biased toward the anode end of diode 26 is complimentary to the preferred flow direction of diode 26, and therefore travels easily there across. The ultimate effect of biasing current in such a direction is that the serial resistance of magneto resistor 18 is effectively lowered, and greater amounts of current flows to sense line 20 than without diode 18.

Conversely, current which is biased toward the cathode end of diode 26 is contrary to the preferred flow direction of diode 26, and therefore current does not travel easily there across. The ultimate effect of biasing current in such a direction is that the serial resistance of magneto resistor 18 is effectively raised, and much smaller amounts of current flows to sense line 20 than without diode 18. The ultimate effect is that the presence and amount of current present in sense line 20 between bit 8, and detector 14 is controlled by the magnetic remnance of bit 8.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

For example, insulation layer 22 may be eliminated in some circumstances. The exact alignment of parts, like diode 26 to magneto resistor 18, are not always essential and may work better if misalignment is encouraged. Diode 26 may also be placed into substrate 24, and even magneto resistor 18 could also be fabricated into substrate 24.

What is claimed is:

1. A ferromagnetic memory cell comprising:
    a) a bit (8), made of a ferromagnetic material, having a remnant polarity;
    b) a write line (15), located proximate the bit (8), coupled to receive a current sufficient to create the remnant polarity; and
    c) a magneto sensor (9) comprising:
        1) a magneto resistor (18), positioned proximate the bit (8), having a serial resistance, and a current flow direction responsive to the remnant polarity of the bit (8); and
        2) a diode (26), coupled across the magneto resistor (18), to effectively control the resistance of the magneto resistor (18).

2. The memory cell of claim 1, wherein the diode (26) has a longitudinal length running substantially perpendicular to a longitudinal length of the magneto resistor (18).

3. The memory cell of claim 1, further comprising:
    a) a sense line (20) coupled to the magneto resistor (18); and
    b) a detector (14) coupled to the sense line (20) which detects the presence and amount of current flowing through the sense line (20).

4. The memory cell of claim 3, wherein the sense line (20) is coupled to the magneto resistor (18) at a first attachment point which provides current to the magneto resistor (18), and at a second attachment point which receives current transferred across the magneto resistor (18).

5. The memory cell of claim 4, further comprising:
    a base (24), oriented in a horizontal plane, wherein the bit (8) has a height that is oriented perpendicular to the horizontal plane of the base (24).

6. The memory cell of claim 5, wherein the magneto sensor (9) is placed below the bit (8) in a substrate (24) upon which the bit (8) is disposed.

7. The memory cell of claim 5, wherein the magneto sensor (9) is placed above the bit (8).

8. The memory cell of claim 5, wherein a digital value of "1" is signified by an amount of current in the sense line (20) between the bit (8) and the detector (14) which is greater than an amount of current present which signifies a digital "0."

9. The memory cell of claim 5, wherein a digital value of "0" is signified by an amount of current in the sense line (20) between the bit (8) and the detector which is greater than an amount of current present which signifies a digital "1."

10. The memory cell of claim 5, wherein the write line (15) circumscribes proximate a periphery of the bit (8).

11. The memory cell of claim 3, wherein an output sense amplifier (11) is coupled to the sense line (20) between the bit (8) and the detector.

12. A method of storing and retrieving binary data, comprising the steps of:
    a) providing a memory bit (8), made of ferromagnetic material, having a remnant polarity;
    b) directing the polarity of the bit (8) by sending a current along a write line (15), located proximate the bit (8); and
    c) detecting the polarity of the bit (8) by:
        1) sending a current through a magneto sensor (9), placed proximate to the bit (8); and
        2) determining the amount of current allowed to flow across the magneto sensor (9).

13. The method of claim 12, wherein the magneto sensor (9) further comprises:
    a) a magneto resistor (18), having a serial resistance, and a current flow direction responsive to the remnant polarity of the bit (8); and
    b) a diode (26), coupled across the magneto resistor (18), having a preferred current flow direction to effectively control the serial resistance of the magneto resistor (18).

14. The method of claim 13, wherein the diode (26) has a longitudinal length running substantially perpendicular to a longitudinal length of the magneto resistor (18).

15. The method of claim 14, further comprising the steps of:
    a) coupling the magneto resistor (18) to a sense line (20); and
    b) coupling the sense line (20) to a detector (14), such that the presence and amount of a current in the sense line (20) is detected by the detector (14).

16. The method of claim 15, wherein the sense line (20) is coupled to the magneto resistor (18) at a first attachment point which provides current to the magneto resistor (18), and at a second attachment point which receives current transferred across the magneto resistor (18).

17. The method of claim 15, wherein the polarity of the bit (8) biases the flow of the current across the magneto resistor (18) in a direction complimentary to the preferred current flow direction of the diode (26), such that the serial resistence of the magneto resistor (18) is effectively lowered.

18. The method of claim 15, wherein the polarity of the bit (8) biases the flow of the current across the magneto resistor (18) in a direction contrary to the preferred current flow direction of the diode (26), such that the serial resistence of the magneto resistor (18) is effectively raised.

19. The method of claim 5, further comprising the step of:
    providing a base (24), oriented in a horizontal plane, wherein the bit (8) has a height that is oriented perpendicular to the horizontal plane of the base (24).

20. The method of claim 19 wherein the magneto sensor (9) is placed below the bit (8) in a substrate (24) upon which the bit (8) is disposed.

21. The method of claim 19 wherein the magneto sensor (9) is placed above the bit (8).

22. The method of claim 15, further comprising the step of:

coupling an amplifier (14) to the sense line (20).

23. The method of claim 15, wherein a digital value of "1" is signified by an amount of current in the sense line (20) between the bit (8) and the detector which is greater than an amount of current present which signifies a digital "0."

24. The method of claim 15 herein a digital value of "0" is signified by an amount of current in the sense line (20) between the bit (8) and the detector which is greater than an amount of current present which signifies a digital "1."

25. The method of claim 15 wherein the write line (15) circumscribes proximate a periphery of the bit.

* * * * *